(12) United States Patent
Rowland

(10) Patent No.: US 6,635,501 B1
(45) Date of Patent: Oct. 21, 2003

(54) LOW TEMPERATURE COBALT SILICIDATION PROCESS MONITOR

(75) Inventor: Daniel Vincent Rowland, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 694 days.

(21) Appl. No.: 09/104,409

(22) Filed: Jun. 25, 1998

(51) Int. Cl.[7] .......................... G01R 31/26; H01L 21/66
(52) U.S. Cl. .............................. 438/14; 438/17; 438/18
(58) Field of Search ............................. 438/14, 17, 18

(56) References Cited

U.S. PATENT DOCUMENTS

| | | | |
|---|---|---|---|
| 4,764,026 A | * 8/1988 | Powell et al. | 374/178 |
| 5,225,366 A | * 7/1993 | Yoder | 117/90 |
| 5,436,494 A | * 7/1995 | Moslehi | 257/467 |
| 5,460,451 A | 10/1995 | Wadman | |
| 5,624,590 A | * 4/1997 | Fiory | 219/390 |
| 5,690,429 A | 11/1997 | Ng | |
| 5,714,392 A | 2/1998 | Dawson et al. | |
| 6,002,109 A | * 12/1999 | Johnsguard et al. | 219/390 |

OTHER PUBLICATIONS

Wolf, Silicon Processing for the VLSI Era, vol. 2: Process Integration, 1990, pp. 150–152.*

* cited by examiner

Primary Examiner—John F. Niebling
Assistant Examiner—Walter L. Lindsay, Jr.
(74) Attorney, Agent, or Firm—Eschweiler & Associates, LLC

(57) ABSTRACT

A method for monitoring temperature in a thermal processing system includes the steps of depositing (105) a cobalt film (104) on a semiconductor substrate (103) and performing thermal processing (108) on the substrate (103) to generate a cobalt silicide film (109). The method further includes measuring (110) a resistance characteristic of the cobalt silicide (109) and determining a temperature of the thermal processing using the resistance characteristic (112).

5 Claims, 7 Drawing Sheets

CoSi 225A sheet resistance vs. temperature

CoSi sheet resistance vs. temperature and thickness short range Rs variation vs. temperature and thickness 225A 470C anneal  queue time

LOW TEMPERATURE COBALT SILICIDATION PROCESS MONITOR

FIELD OF THE INVENTION

The present invention generally relates to semiconductor processing and more particularly relates to temperature monitoring in rapid thermal processing systems in order to control the formation of silicides for contacts and conductive lines in semiconductor integrated circuits.

BACKGROUND OF THE INVENTION

As the feature size of semiconductor integrated circuits continue to decrease, the necessity of decreasing the resistance and capacitance associated with interconnection paths (i.e., contacts) and conductive lines becomes more critical. For example, in a MOS transistor structure, the RC delay due to the interconnect paths can exceed the delays due to gate switching. Therefore the higher the RC product, the more likely a circuit's operating speed will be limited by the delay. Consequently, low resistivity interconnections and conductive lines are crucial in order to fabricate dense, high performance integrated circuit devices.

One solution to the above problem of contact resistivity is the use of silicides (e.g., $WSi_2$ and $TiSi_2$). Silicides exhibit a reduced resistance as compared to polysilicon and are easy to form (e.g., via direct metallurgical reaction, co-evaporation, sputtering or chemical vapor deposition (CVD)). Although silicides may be formed at differing stages of the semiconductor manufacturing process, suicides are often formed after formation of the MOS structure using a self-aligned silicide ("salicide") process, which is illustrated in prior art FIGS. 1a–1e.

As illustrated in prior art FIG. 1a, a MOS transistor 10 is bounded by outside isolation regions 12. The transistor 10 includes a gate 14 and a gate oxide 16 which overlies a substrate 18 and separates the substrate 18 into a source region 20 and a drain region 22. A source 24 and a drain 26 are formed in the source region 20 and the drain region 22, respectively, through the gate oxide 16 to form shallow junctions.

As illustrated in prior art FIG. 1b, the oxide 16 is removed in the source region 20 and the drain region 22 and insulated sidewall spacers 28 are formed on the lateral edges of the gate 14 and the gate oxide 16. A conductive film 30 (the type of conductor will depend on the type of silicide desired) is then formed over the transistor 10, as illustrated in prior art FIG. 1c, and subjected to thermal processing. The thermal processing causes the conductor/silicon interface regions to react, thereby resulting in the formation of a source silicide 32 in the source region 20, a drain silicide 34 in the drain region 22 and a gate silicide 36 on the gate 14 as shown in FIG. 1d. The sidewall spacers 28 do not experience a reaction with the conductive layer during thermal processing and prevent the shorting of the source 24 in the drain 26 to the gate 14 via the silicide. The unreactive conductive material is then removed with an etchant that does not attack the silicides, as illustrated in prior art FIG. 1d.

A dielectric layer 38 is then deposited over the transistor 10 and contact holes are formed down to the source silicide 32, the drain silicide 34 and the gate silicide 36, respectively. A conductive contact layer (e.g., aluminum) is then formed and etched to form contacts 40a, 40b and 40c, as illustrated in prior art FIG. 1e. The resistivity is greatly reduced since the sheet resistance of the resulting silicide is about 1–2 ohms/square whereas the sheet resistance of the diffused junctions without the silicide is about 40–120 ohms/square.

The thermal processing utilized to form the silicides is preferably rapid thermal processing (RTP) to prevent significant diffusion of the source 24 and drain 26 and thereby maintain shallow junctions. The sheet resistance of the resulting silicides are strong functions of the annealing temperature. Consequently, a tight control of the RTP temperature is desired. Several prior art type temperature monitors have been utilized to monitor the temperature within the RTP chamber. The RTP apparatus itself incorporates a thermal sensor; however, the apparatus utilizes closed-loop control, therefore the apparatus always indicates the desired temperature and does not provide a secondary, independent monitoring system. Consequently, any calibration or internal system errors in the apparatus remain undetected. Temperature sensors such as thermocouples have also been utilized. Thermocouples, however, measure only the temperature of the gas within the chamber and do not accurately measure the reaction temperature at the silicon/conductor interface which dictates the resulting silicidation reaction and sheet resistance.

Another prior art method of monitoring the RTP silicidation temperature uses a temperature sensor called a pyrometer. A pyrometer measures the temperature of an object by measuring the quantity of thermal radiation from an object's surface and converting it to a surface temperature. Therefore the relationship between the thermal radiation and the temperature is dependent upon the emissivity of the surface. Pyrometers experience difficulty because many detect emissivities in limited wavelengths and ignore emissivities in other regions of the spectrum. This assumes that emissivity occurs at a constant level across the frequency spectrum which is an erroneous assumption.

In addition, the amount of energy reflected and absorbed from the surface is highly dependent on the type of wafer film and furthermore is highly dependent on the position along the wafer surface. Differences in the types of material and their thicknesses result in variability in the absorption and reflectivity of local areas on the wafer surface which results in variations in emissivity at different regions of the semiconductor wafer. Consequently, pyrometers do not accurately indicate the temperature at the silicon/conductor interface which governs the resulting silicide sheet resistance.

Another prior art method for monitoring RTP process temperatures includes measuring a sheet resistance of a film after thermal processing. These type of monitors, however, have primarily focused on high RTP temperature ranges above 650° C. As RTP process temperatures continue to decrease to maintain ultra shallow junctions, no accurate sheet resistance monitors have been developed.

Therefore it is desired to generate an accurate method for monitoring the temperature of silicidation processes.

SUMMARY OF THE INVENTION

The present invention relates to a method for monitoring a temperature in a rapid thermal processing (RTP) step. The method utilizes the silicidation reaction of a cobalt film on silicon by measuring the resultant cobalt silicide sheet resistance to determine the reaction temperature at the cobalt/silicon interface.

According to one aspect of the present invention, a cobalt film is deposited onto a silicon wafer and a RTP step is performed at a desired target temperature, thereby generating a cobalt silicide. A cobalt silicide sheet resistance measurement is taken and the actual RTP temperature is determined using a sheet resistance-temperature transformation curve.

According to another aspect of the present invention, a cobalt film sheet resistance measurement is taken prior to the silicidation to take into account the post silicidation sheet resistance dependence on the pre-RTP sheet resistance. The actual RTP temperature is then determined using either a three dimensional sheet resistance-temperature plane or surface.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
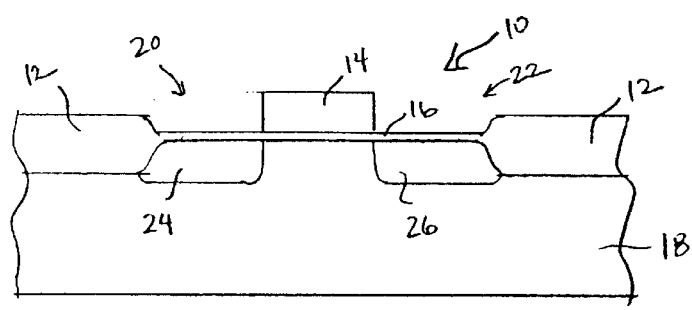
FIG. 1a is a prior art fragmentary cross-section diagram illustrating a MOS transistor.
Figure 1B:
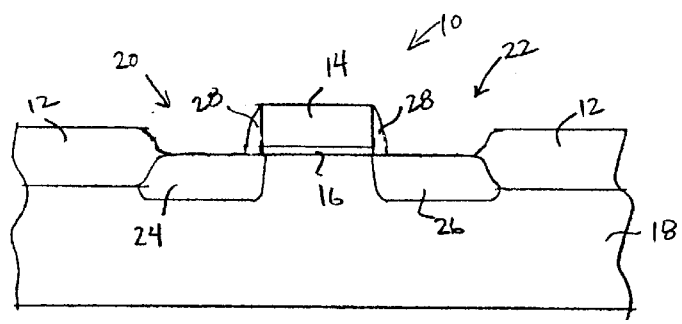
FIG. 1b is a prior art fragmentary cross-section diagram illustrating the MOS transistor of FIG. 1a having sidewall spacers formed on a lateral edge of the gate and the gate oxide.
Figure 1C:
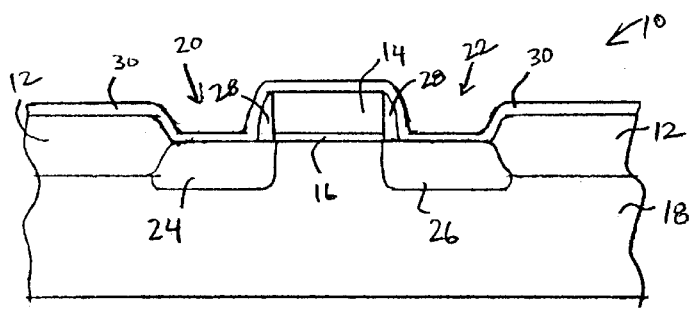
FIG. 1c is a prior art fragmentary cross-section diagram illustrating the MOS transistor of FIG. 1a having a conductive layer overlying the transistor.
Figure 1D:
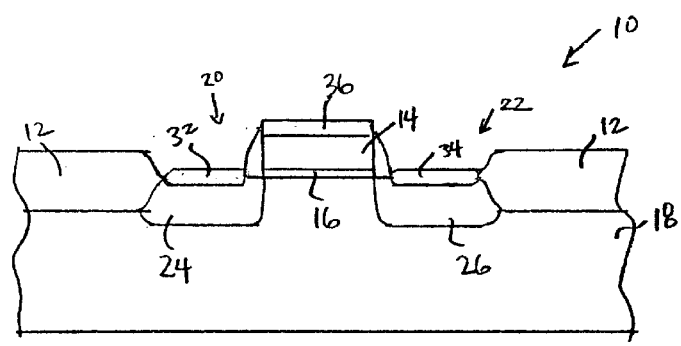
FIG. 1d is a prior art fragmentary cross-section diagram illustrating the MOS transistor of FIG. 1a after thermal processing, wherein the conductive layer reacts with the underlying silicon to form a source silicide, a drain silicide and a gate silicide, respectively.
Figure 1E:
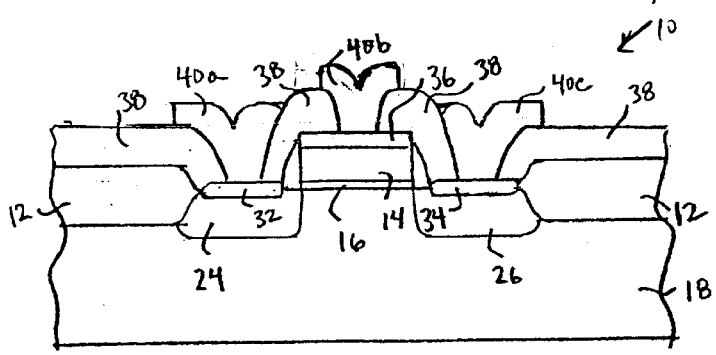
FIG. 1e is a prior art fragmentary cross-section diagram illustrating the MOS transistor of FIG. 1a having an overlying dielectric layer with contact holes formed therein and conductive contacts formed on the transistor.

The following is a detailed description of the present invention made in conjunction with the attached Figures, wherein like reference numerals will refer to like elements throughout. The present invention relates to a method for monitoring the temperature in an integrated circuit process step. The method monitors the temperature of a rapid thermal processing step by measuring a resultant cobalt silicide resistance characteristic and correlating the resistance characteristic to the temperature via a transformation curve. The impact of a resistance characteristic of the cobalt film prior to silicidation on the resultant silicide resistance may be taken into account by measuring the cobalt resistance characteristic and plotting both the pre and post silicidation resistance characteristics on either a three dimensional transformation plane or surface. The present invention therefore overcomes the limitations of the prior art by accurately determining the process temperature by analyzing the characteristics of the silicide generated by the thermal process itself.

As stated earlier, using silicides in semiconductor device contacts and polysilicon conductive lines is desirable since silicides substantially reduce the sheet resistance of the interconnections and lines, respectively. Within the vast number of potential silicides which are available, the group VIII silicides ($PtSi$, $Pd_2Si$, $CoSi_2$ and $NiSi_2$) and titanium silicide ($TiSi_2$) have desirable properties since they are amenable to applications requiring transistors to have shallow junctions. First, each of the above silicides provide lower resistivities than the refractory metal silicides of tungsten (W), tantalum (Ta) and molybdenum (Mo). Second, each of these silicides react favorably with silicon (Si) at a temperature of 600° C. or less. Third, when the silicides form at low temperatures, the metal atoms diffuse into and react with the silicon. As the metal atoms diffuse into the neighboring oxide (e.g., the $SiO_2$ oxide sidewall spacers) the silicon is not available for reaction during the silicide formation, thereby preventing shorting between the source/drain and the gate. Lastly, after silicidation, the unreactive metal can be etched off the oxide surface using etchants that do not attack the oxide, the silicide or the substrate silicon, which allows self-aligned contacts to be formed through the use of these contact silicide materials.

Although $TiSi_2$ is the most widely implemented material for the silicidation process, cobalt silicide recently has received a substantial amount of attention as an alternative silicide material. Cobalt silicide is attractive for at least the following reasons. First, cobalt silicide exhibits a low resistivity of about 16–18 ohms-cm and has a high temperature stability. Consequently, the silicide is stable when in contact with the silicon up to 900° C. which allows the silicide to be used with a subsequent 900° C. glass-reflow step. Contacts to shallow arsenic (As) and boron (B) junctions can be fabricated without adversely impacting the dopant profiles and contacts may be successfully formed to both n+ and p+ silicon. In addition, cobalt silicide is less susceptible to removal by plasma etching than titanium silicide. Consequently, with cobalt silicide there is negligible silicide loss during an overetch that may be needed in dry etching the contact openings through the overlying glass dielectric layer. Lastly, no competing reactions occur during the silicidation process while lower shear forces are present in the cobalt silicide than in the titanium silicide of the same thickness. Consequently, since cobalt silicide is quickly becoming a desirable silicide material for semiconductor integrated circuits, the present invention is directed toward a method for monitoring the thermal processing temperature of a cobalt silicide process.

Figure 2:
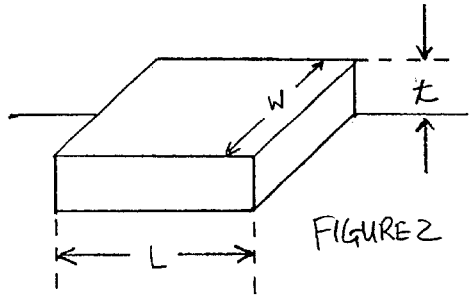
FIG. 2 is a perspective view of a conductive film used for illustrating the principle of a film's sheet resistance.

The present invention monitors the silicidation temperature by measuring a resistance characteristic of the resulting silicide and determining the silicidation reaction temperature therefrom. The resistance characteristic, according to the preferred embodiment of the present invention, is the sheet resistance Rs of the cobalt silicide. The sheet resistance Rs of a film is determined as follows in conjunction with FIG. 2. The resistance (R) of a rectangular shaped film of length (L), width (W) and thickness (t) is given by the equation: $R=\rho L/tW$, wherein $\rho$ equals the resistivity of the film which is unique for a given material and measured in ohms-cm. If the length L is equal to the width W, then the rectangle is a square and the equation reduces to $R=\rho/t=Rs$, wherein Rs is the sheet resistance in ohms/square and is independent of the size of the square (but does depend on the resistivity of material and the thickness of the film). Therefore the resistivity and the sheet resistance are distinct parameters that are related by the above equation.

Figure 3:
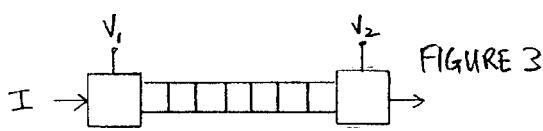
FIG. 3 is a plan view of a direct measurement method for measuring a sheet resistance of a conductor.

The sheet resistance Rs of the film can be measured by several techniques, wherein each is contemplated as falling within the scope of the present invention. One technique is the direct measurement method, as illustrated in FIG. 3. In the direct measurement technique, a conductive strip (e.g., the silicide film in the present invention) is fabricated and the voltage drop ($V_1-V_2$) across the strip is measured as a current I is driven through the conductor. The resistance R is then calculated by $(V_1-V_2)/I$. The number of squares are then counted between the voltage terminals (in the present example, N=7) and the sheet resistance is calculated by R/N=Rs (ohms/square).

Figure 4:
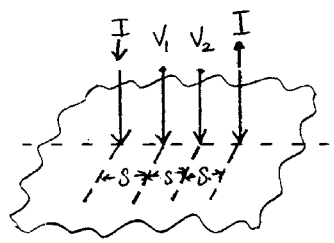
FIG. 4 is a fragmentary perspective view illustrating a four-point probe method for measuring a sheet resistance of a film.

A second method for determining sheet resistance of a material is the four-point probe method, as illustrated in FIG. 4. If the sample may be approximated as semi-infinite with respect to the spacings (s) between the four probes (which are spaced apart substantially equally from one another), the current is driven as shown and the voltage drop ($V_1-V_2$) is measured as illustrated in FIG. 4, the sheet resistance may be calculated according to the following equation: $Rs=(V_1-V_2)(2\pi s)/It$.

The method 100 according to the preferred embodiment of the present invention will now be described in conjunction with FIG. 5. The method 100 begins with a wafer preparation step 102, which preferably includes cleaning a silicon wafer 103. The cleaning step preferably includes pre-cleaning with an RCA clean followed by a HF (hydrofluric acid) etch. The RCA cleaning method is a widely used cleaning method and includes a preliminary cleaning by plasma oxidation, stripping and/or emersion in an organic resistive stripper (e.g., $H_2SO_4-H_2O_2$). The wafer 103 is then rinsed in deionized and filtered water. The wafer 103 is then submerged in a $H_2O-NH_4OH-H_2O_2$ mixture and again rinsed to remove residual organic contaminants and metals and then is submerged in HF and again rinsed which strips the hydrous oxide film. Lastly, the wafer 103 may be submerged in a mixture of $H_2O:HCl:H_2O_2$ and again rinsed to desorb any remaining atomic and ionic contaminants, dried in $N_2$ and then stored in a nitrogen dry box until time for use. Although the preferred embodiment of the present invention incorporates the wafer preparation step 102, it should be understood that the present invention may be performed without the step and such an alternative method is contemplated as falling within the scope of the present invention.

Figure 6A:
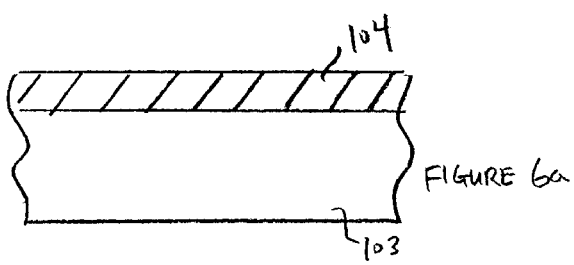
FIG. 6a is a fragmentary cross-section diagram illustrating a silicon wafer having a cobalt film formed thereon.

After wafer cleaning, a cobalt film 104 is deposited over the silicon wafer 103 at step 105, as illustrated in FIG. 6a. Preferably the cobalt film 104 is deposited at a thickness of about 225 Angstroms, however, other film thicknesses are also contemplated by the present invention. The cobalt film 104 is uncapped and preferably the sheet resistance Rs of the film is measured prior to thermal processing at step 106. Step 106, however, may alternatively be skipped. Preferably, the sheet resistance Rs of the cobalt film 104 is measured at step 106 via an automated four-point probe measurement apparatus and the measured data is stored in an associated memory. Alternatively, a manual measurement and data recordation step also may be utilized and is contemplated as falling within the scope of the present invention.

Preferably, the silicon wafer is a lightly doped P-silicon substrate, however, it is not required. Alternatively, other types of starting material may also be used in conjunction with the present invention. In addition, although the cobalt film 104 is preferably uncapped, the film 104 may alternatively be capped with, for example, titanium or TiN.

Figure 6B:
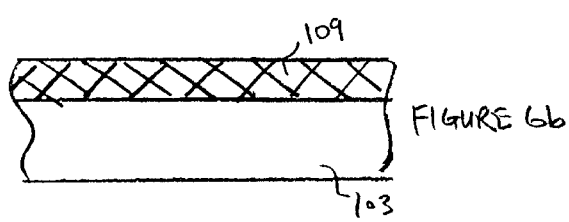
FIG. 6b is a fragmentary cross-section diagram illustrating the silicon wafer of FIG. 6a after thermal processing, wherein a cobalt silicide film is generated thereon.

Once the pre-anneal sheet resistance measurement is complete at step 106, the wafer is subjected to thermal processing such as a rapid thermal processing RTP step at step 108. Preferably the RTP is performed at a targeted temperature range of about 400–700° C. and more preferably in the range of about 450–600° C. and most preferably at about 470° C. The RTP duration is within a range of about 30 to 120 seconds and is most preferably about 60 seconds. During RTP, the cobalt film 104 reacts with the underlying silicon 103 to form a cobalt silicide film 109, as illustrated in FIG. 6b. After formation of the silicide 109, a post-anneal sheet resistance Rs measurement is taken at step 110 in a manner similar to step 106.

Figure 7:
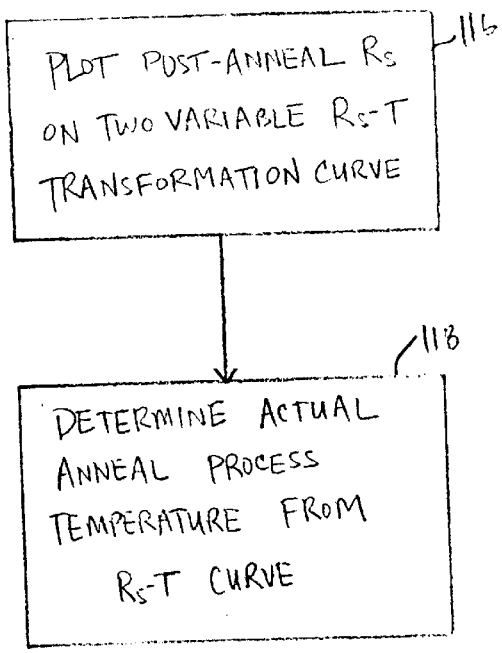
FIG. 7 is a flow chart diagram illustrating in greater detail the step of determining the process temperature of FIG. 5 using a two dimension sheet resistance-temperature transformation curve.
Figure 8:
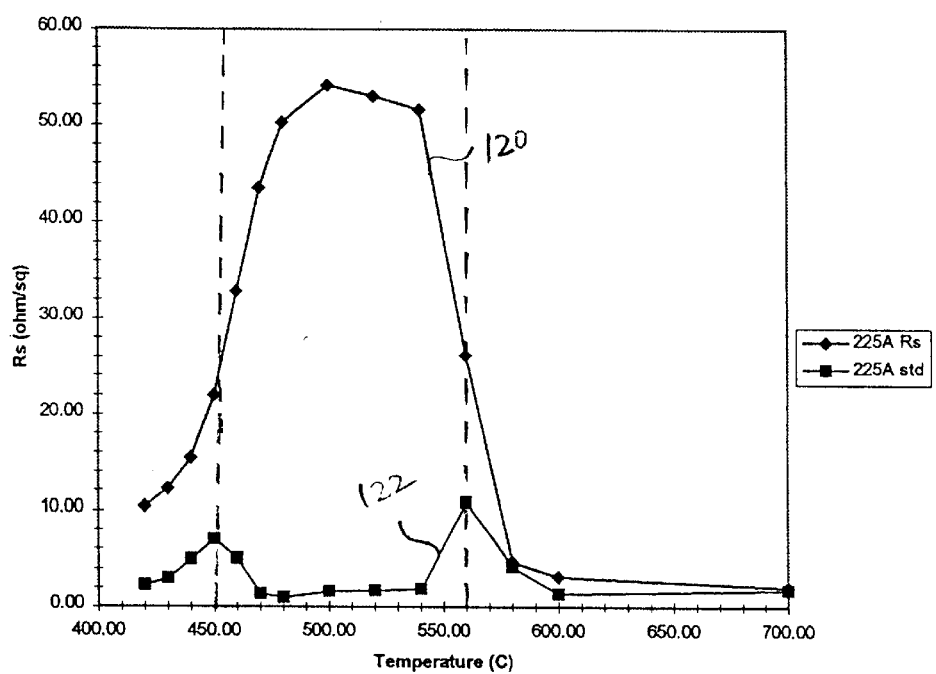
FIG. 8 is a graph illustrating the sheet resistance over a range of temperatures for a 225 Angstrom cobalt silicide film.

The present invention determines the RTP process temperature of step 108 at step 112 by correlating the post-anneal Rs measurement of step 110 to temperature. According to one embodiment of the present invention, the correlation of step 112 is performed as illustrated in FIG. 7 by plotting the post-anneal Rs on a two-variable (two dimensional) sheet resistance-temperature transformation curve at step 116 and determining the RTP process temperature from a sheet resistance-temperature transformation curve at step 118, as illustrated in the curve 120 of FIG. 8. FIG. 8 shows the sheet resistance transformation curve of a 225 Angstrom cobalt silicide film. The curve inflections or breakpoints correspond to crystallographic phase changes in the silicide, which are clearly seen as spikes on the standard deviation plot 122 in FIG. 8. The transformation curve 120 can be divided into three main sections: (1) a cobalt rich mixture ($Co_2Si$), (2) a cobalt monosilicide (CoSi), and (3) a cobalt disilicide ($CoSi_2$). The cobalt rich $Co_2Si$ exists at temperatures below about 455° C., the monosilicide phase exists between about 455–560° C. and disilicide phase occurs above 560° C. The transformation curves were constructed using the production apparatus used for rapid thermal processing, which in this particular embodiment is an Applied Materials 5200 RTP system. In addition, the Rs measurements for the curves were made using a 49-point Prometrix map pattern using a Prometrix RS-55.

Figure 9:
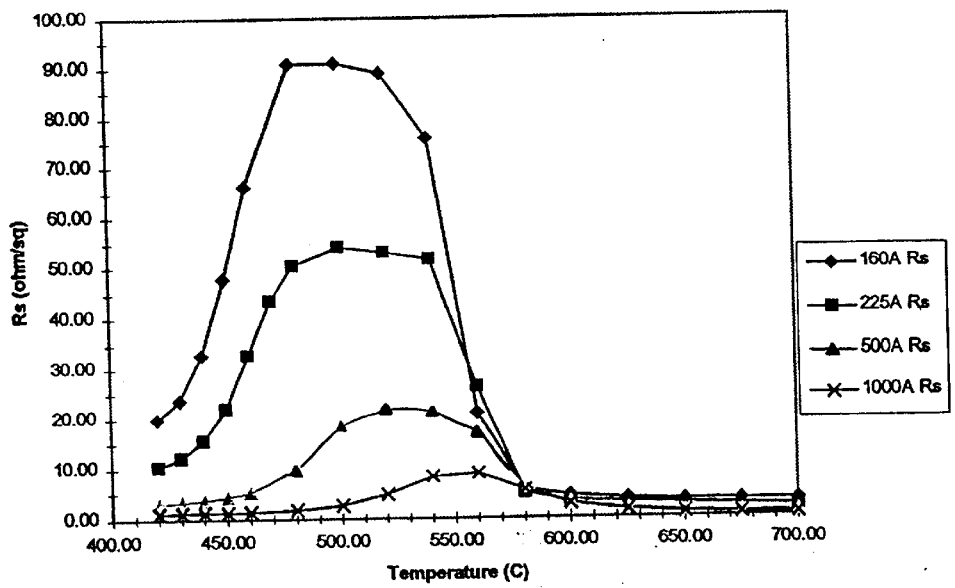
FIG. 9 is a graph illustrating the sheet resistance over a range of temperatures for cobalt silicide films of varying thicknesses.

Various types of sheet resistance-temperature transformation curves (corresponding to different silicide film thicknesses) may be utilized and are contemplated as falling within the scope of the present invention, however, a 225 Angstrom silicide film curve is the preferred film thickness curve for at least the following reasons. FIG. 9 illustrates sheet resistance-temperature transformation curves for cobalt silicide for cobalt film thicknesses of 160 Angstroms, 225 Angstroms, 500 Angstroms and 1,000 Angstroms, respectively. For cobalt films less than 225 Angstroms, the peak sheet resistance Rs corresponding to the monosilicide phase is too close to the sheet resistance at the target process temperature. In the monosilicide range, there is wide range of temperatures for which the resistance is approximately constant and consequently there is negligible resistance sensitivity to temperature. Increasing the film thickness to greater than 225 Angstroms (e.g., 500 Angstroms or 1,000 Angstroms) also decreases the sensitivity (see, for example, the slopes of the curves in FIG. 9) and consequently reduces the resolution of the monitor. Therefore using a cobalt film thickness of about 225 Angstroms is preferred because it balances the above-described considerations and because a sensitivity for this film thickness is an easily remembered quantity of approximately 1 Ohm/° C.

Figure 10:
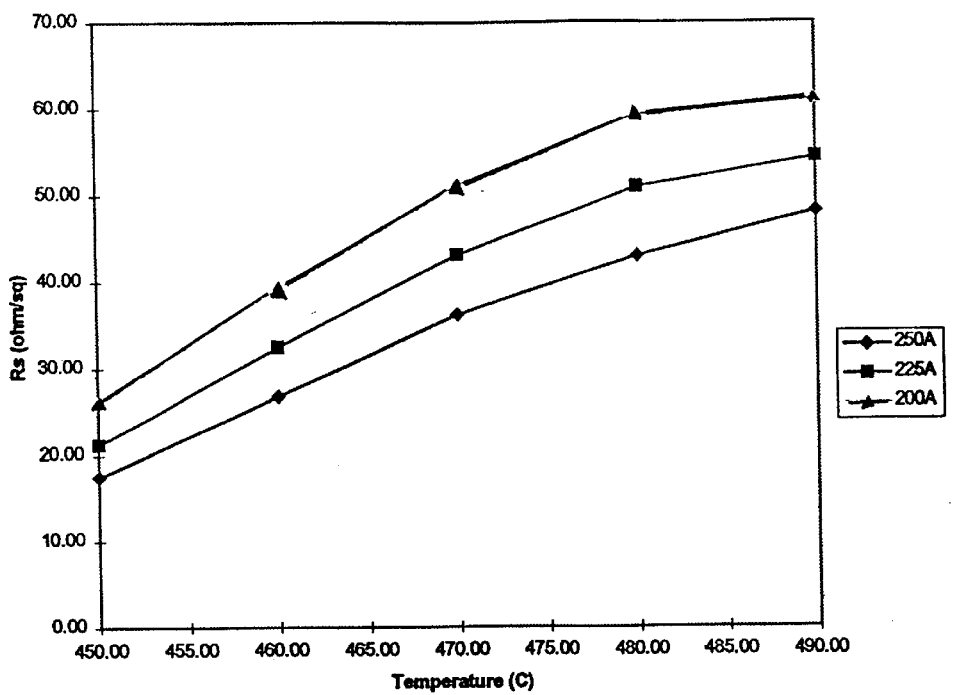
FIG. 10 is a graph illustrating the variation in sheet resistance of cobalt silicide films having varying thicknesses over a more narrow range of temperatures.

As can be seen from FIG. 9, the effect of the initial sheet resistance Rs (due to variations in film thickness) has a substantial impact on the post-anneal film sheet resistance. As seen in FIG. 9, increasing the film thickness decreases the sensitivity and the peak Rs and shifts the phase transformations to higher temperatures. In practice, however, the cobalt film thickness can be controlled more tightly than plus or minus 250 Angstroms and a more typical film thickness variation will instead vary in the range of 225 Angstroms plus or minus 25 Angstroms (200–250 Angstroms). Therefore, according to another embodiment of the present invention, the pre-anneal sheet resistance measurement 106 of FIG. 5 may be utilized to account for initial sheet resistance variations and increase the accuracy of the temperature monitor. FIG. 10 graphically illustrates the sheet resistance-temperature data for three film thicknesses (corresponding to the potential variation in cobalt film deposition: 200, 225 and 250 Angstroms, respectively) at five temperatures: 450° C., 460° C., 470° C., 480° C. and 490° C. Note that although these curves are parabolic in the 450–490° C. temperature range, the curves may be approximated with a linear approximation if the temperature range is further narrowed. Using a least squares fit, for example, the temperature sensitivities for 200 Angstroms, 225 Angstroms and 250 Angstrom films in a range of 460° C.–480° C. may be approximated as 1.01, 0.923 and 0.881 Ohms/C, respectively.

The data from FIG. 10 can be presented as a three-dimensional plane (not shown), wherein the temperature (Z axis) is a function of the pre-anneal sheet resistance Rs (X axis) and the post-anneal sheet resistance Rs (Y axis). Using the above approximation, an equation for the plane can be calculated, resulting in the following equation:

$$323.7X-30.66Y+27.44Z=13359.7$$

Figure 5:
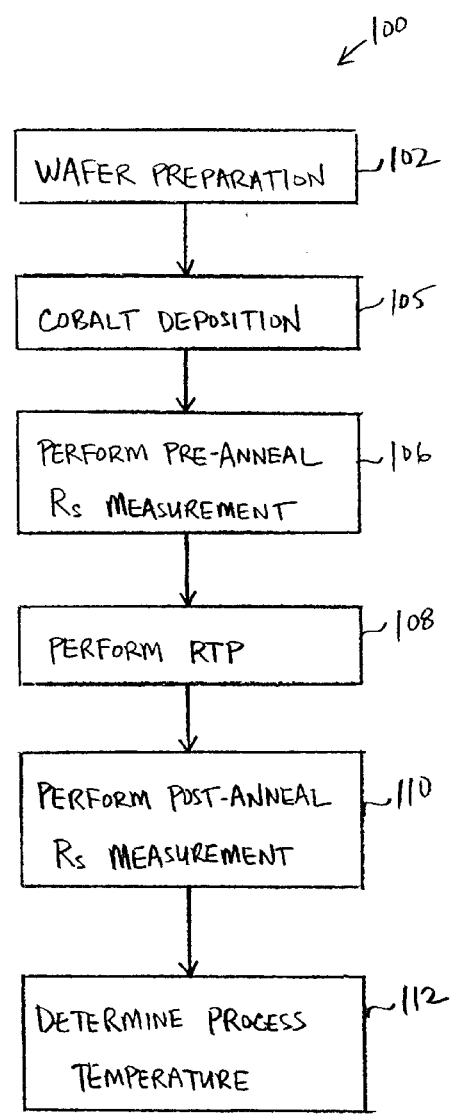
FIG. 5 is a flow chart illustrating the steps for monitoring a thermal processing temperature according to the present invention.
Figure 11:
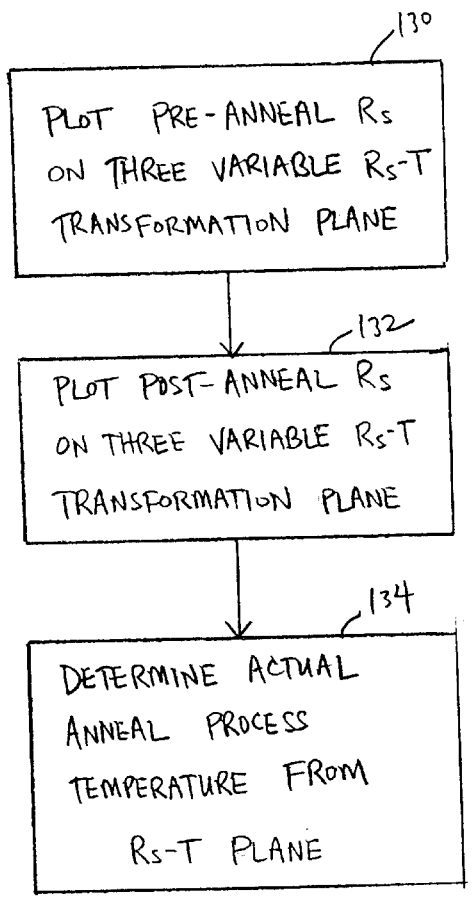
FIG. 11 is flow chart illustrating in greater detail the step of determining the process temperature of FIG. 5, wherein a three dimensional sheet resistance-temperature transformation plane is utilized.

Consequently, as illustrated in FIG. 11, the step of 112 of FIG. 5 may incorporate the impact of initial pre-anneal sheet resistance Rs variations (due to, for example, cobalt film thickness variations) on the post-anneal sheet resistance Rs by plotting the pre-anneal sheet resistance Rs on the three variable (three-dimension) Rs-T transformation plane in step 130, plotting the post-anneal sheet resistance Rs on the Rs-T transformation plane in step 132 and then determining the actual process temperature from the plane at step 134. Alternatively, knowing the X and Y variables above (the pre and post Rs values, respectively), the temperature may be determined using the above equation via a programmed processor, for example.

Figure 12:
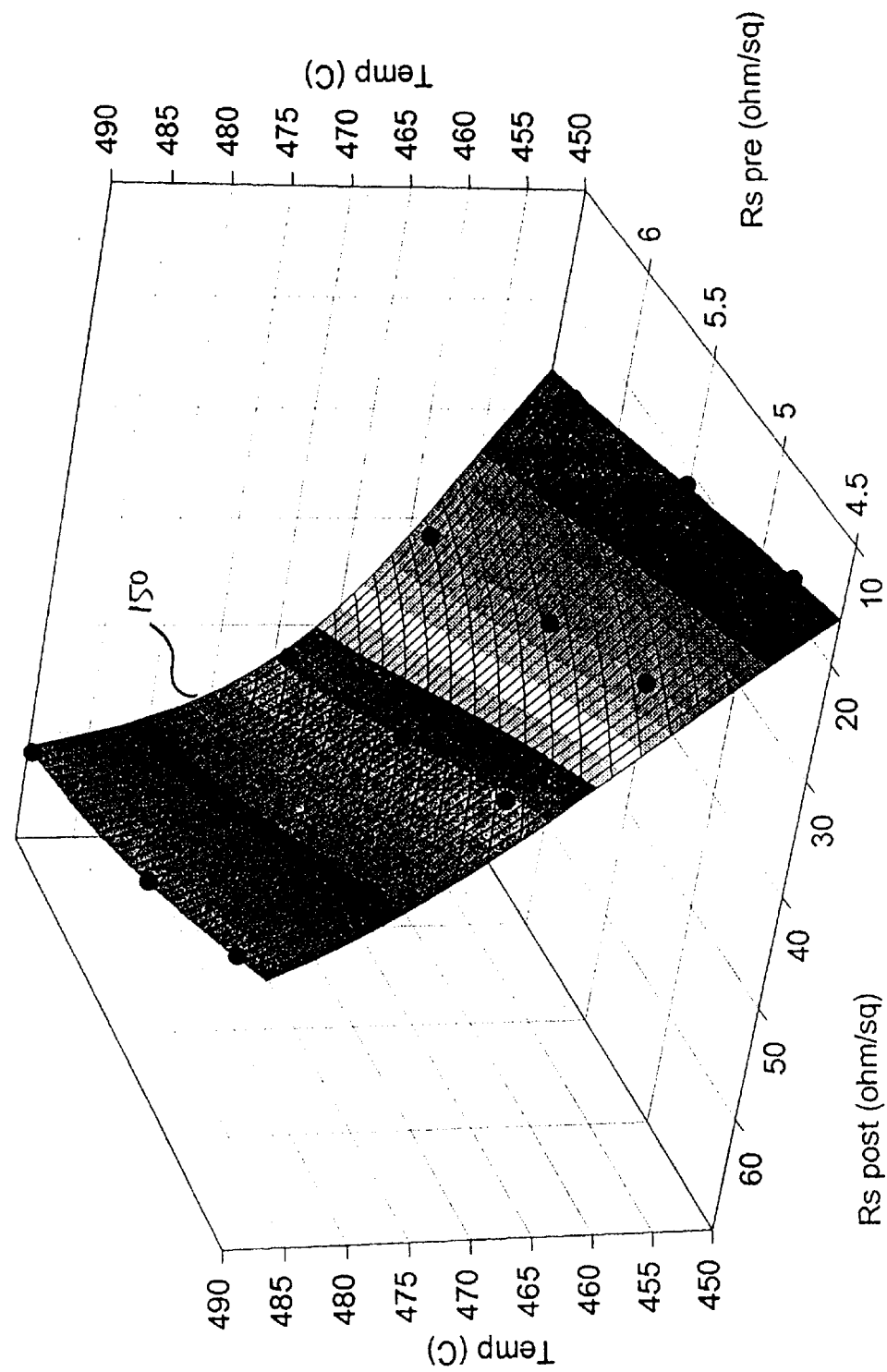
FIG. 12 is a three dimensional graph illustrating a sheet resistance-temperature transformation surface.

Note that on the graph of FIG. 10, the determined anneal temperature is based on a linear model over a narrow temperature range (460° C.–480° C.). Outside this temperature range, however, the planar assumption is no longer valid. Alternatively, if a higher degree of accuracy is required, the planar assumption within the narrowed range may not be adequate. Therefore according to another alternative embodiment of the present invention, the data from FIG. 10 may be utilized to generate a three-dimensional non-planar surface 150, as illustrated in FIG. 12. The surface 150 is characterized by the following exemplary equation:

$$Z=(419.73-7.9549X+0.36658X^2-76.22 \ln Y-3.449(\ln Y)^2)/(1-0.0056229X-0.22844 \ln Y)$$

It should be noted that many equations for surfaces may be found to approximate the three-dimensional surface and each are contemplated as falling within the scope of the present invention.

Figure 13:
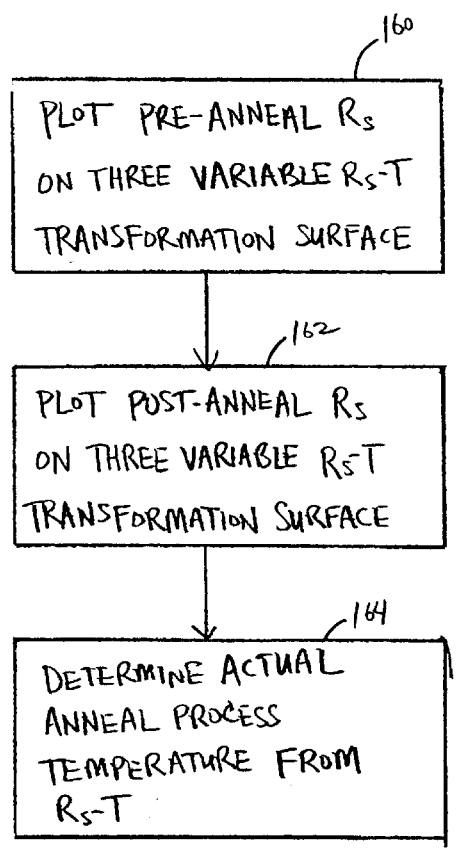
FIG. 13 is a flow chart illustrating in greater detail the step of determining the process temperature of FIG. 5, wherein the three dimensional sheet resistance-temperature transformation surface of FIG. 12 is utilized.

Consequently, as illustrated in FIG. 13, the step 112 of FIG. 5 may incorporate the impact of initial pre-anneal sheet resistance Rs variations on the post-anneal sheet resistance Rs by plotting the pre-anneal Rs on a three variable (three dimensional) Rs-T transformation surface 150 at step 160, plotting the post-anneal Rs on the Rs-T transformation surface 150 at step 162, and then determining the anneal temperature from the Rs-T transformation surface 150 at step 164. Alternatively, knowing the X and Y variables (the pre and post Rs values, respectively), the temperature may be determined using the above equation via a programmed processor, for example.

Figure 14:
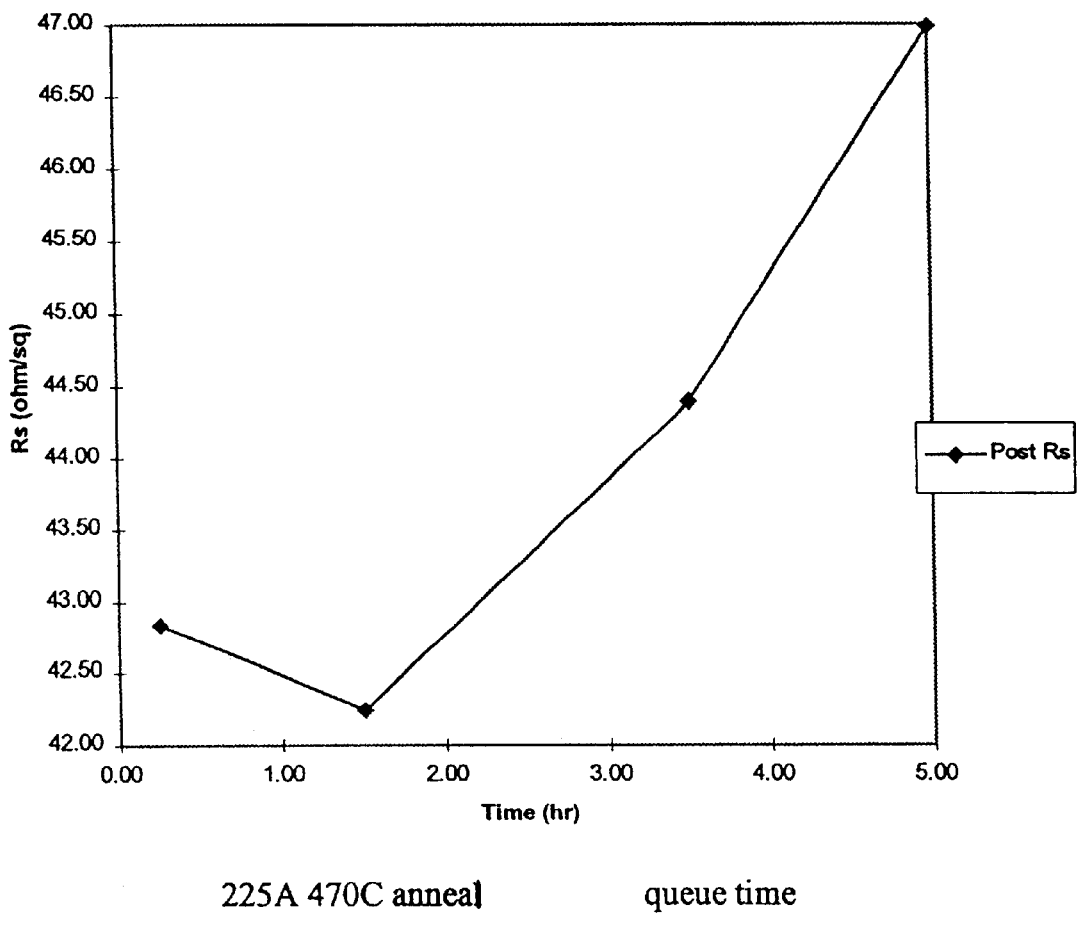
FIG. 14 is a graph illustrating the impact of the queue time between the wafer preparation step and the cobalt deposition step of FIG. 5 on the resulting sheet post-anneal sheet resistance measurement.

According to yet another embodiment of the present invention, a queue time between the wafer preparation step 102 and the cobalt deposition step 105 of FIG. 5 is monitored and controlled to be less than about two hours. As illustrated in FIG. 14, the post-anneal sheet resistance Rs of a 225 Angstrom cobalt silicide film annealed at 470° C. was measured as the queue time between the wafer preparation step 102 and the cobalt deposition step 105 was varied. When the deposition queue time is between about 0–2 hours, the post-anneal sheet resistance Rs is relatively stable at about 42.5 Ohms/square. Between about 2–5 hours, however, the post-anneal sheet resistance rises to about 47 Ohms/square. The increase in the sheet resistance Rs is due to the growth of native oxide on the silicon wafer surface which interferes with the subsequent silicidation reaction. The increase of Rs would result in an apparent 3.5° C. increase in RTP temperature which would be erroneous. Consequently, it is desirable to maintain the queue time to be less than 2 hours to avoid the apparent temperature variation. Alternatively, an additional etch, for example, a sputter etch, may be conducted immediately prior to the cobalt film deposition step 105 to insure that no native oxide is present on the silicon wafer. In this manner, accurate temperature monitoring may be obtained independent of the queue time. In yet another alternative embodiment of the present invention, the apparent variation due to the queue time can be used as an offset correction factor in the final temperature calculation. In this embodiment, the queue time would be monitored and utilized in the RTP temperature determination.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for monitoring temperature in a thermal processing system, comprising the steps of:
    depositing a cobalt film on a semiconductor substrate;
    measuring a resistance characteristic of the cobalt film prior to generating a cobalt silicide;
    performing thermal processing on the substrate, thereby generating the cobalt silicide film;
    measuring a resistance characteristic of the cobalt silicide; and
    determining a temperature of the thermal processing using the resistance characteristic of the cobalt film and the cobalt silicide film, respectively.

2. A method for monitoring temperature in a thermal processing system, comprising the steps of:
    depositing a cobalt film on a semiconductor substrate;
    measuring a resistance characteristic of the cobalt film prior to generating a cobalt silicide;
    performing thermal processing on the substrate, thereby generating the cobalt silicide film;
    measuring a resistance characteristic of the cobalt silicide; and
    determining a temperature of the thermal processing using the resistance characteristic of the cobalt film and the cobalt silicide film, respectively, wherein the step of determining the temperature comprises:
        plotting the resistance characteristic of the cobalt silicide on a sheet resistance-temperature transformation plane;
        plotting the resistance characteristic of the cobalt film on the sheet resistance-temperature transformation plane; and
        determining the temperature from the transformation plane, thereby accounting for variations in the cobalt film resistance characteristic on the cobalt silicide resistance characteristic.

3. A method for monitoring temperature in a thermal processing system, comprising the steps of:
    depositing a cobalt film on a semiconductor substrate;
    measuring a resistance characteristic of the cobalt film prior to generating a cobalt silicide;
    performing thermal processing on the substrate, thereby generating the cobalt silicide film;
    measuring a resistance characteristic of the cobalt silicide; and
    determining a temperature of the thermal processing using the resistance characteristic of the cobalt film and the cobalt silicide film, respectively, wherein the step of determining the temperature comprises:
        plotting the resistance characteristic of the cobalt silicide on a sheet resistance-temperature transformation surface;
        plotting the resistance characteristic of the cobalt film on the sheet resistance-temperature transformation surface; and
        determining the temperature from the transformation surface, thereby accounting for variations in the cobalt film resistance characteristic on the cobalt silicide resistance characteristic.

4. The method of claim 1, wherein the cobalt film thickness is about 225 Angstroms.

5. The method of claim 1, further comprising the steps of:
    cleaning the substrate before depositing the cobalt film thereon; and
    maintaining a queue time between the substrate preparation and the cobalt film deposition of less than about 2 hours.

* * * * *

UNITED STATES PATENT AND TRADEMARK OFFICE
CERTIFICATE OF CORRECTION

PATENT NO. : 6,635,501 B1 Page 1 of 1
DATED : October 21, 2003
INVENTOR(S) : Daniel Vincent Rowland It is certified that error appears in the above-identified patent and that said Letters Patent is hereby corrected as shown below:

Column 1,
Line 30, please replace the word "suicides" with the word -- silicides --.

Signed and Sealed this

Twenty-third Day of December, 2003

JAMES E. ROGAN
*Director of the United States Patent and Trademark Office*